(12) United States Patent
Yamauchi et al.

(10) Patent No.: US 7,170,119 B2
(45) Date of Patent: Jan. 30, 2007

(54) VERTICAL TYPE SEMICONDUCTOR DEVICE

(75) Inventors: Shoichi Yamauchi, Nagoya (JP);
Hitoshi Yamaguchi, Nisshin (JP);
Takashi Suzuki, Nishikamo-gun (JP);
Kyoko Nakashima, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/549,151

(22) PCT Filed: Aug. 20, 2004

(86) PCT No.: PCT/JP2004/011969

§ 371 (c)(1),
(2), (4) Date: Sep. 15, 2005

(87) PCT Pub. No.: WO2005/020275

PCT Pub. Date: Mar. 3, 2005

(65) Prior Publication Data

US 2006/0170037 A1    Aug. 3, 2006

(30) Foreign Application Priority Data

Aug. 20, 2003   (JP) .............................. 2003-295946

(51) Int. Cl.
*H01L 29/72* (2006.01)
(52) U.S. Cl. ...................... 257/288; 257/328; 257/331; 257/341; 257/401
(58) Field of Classification Search ................ 257/288, 257/328, 331, 341, 401
See application file for complete search history.

(56) References Cited

U.S. PATENT DOCUMENTS

| | | | |
|---|---|---|---|
| 6,512,268 | B1 | 1/2003 | Ueno |
| 6,639,260 | B2 | 10/2003 | Suzuki et al. |
| 6,693,338 | B2 | 2/2004 | Saitoh et al. |
| 2001/0028083 | A1 | 10/2001 | Onishi et al. |
| 2002/0171093 | A1 | 11/2002 | Onishi et al. |
| 2003/0160262 | A1 | 8/2003 | Kitada et al. |
| 2003/0176031 | A1 | 9/2003 | Onishi et al. |
| 2003/0222327 | A1 | 12/2003 | Yamaguchi et al. |
| 2004/0016959 | A1* | 1/2004 | Yamaguchi et al. ........ 257/327 |

FOREIGN PATENT DOCUMENTS

JP      A-2004-22716      1/2004

* cited by examiner

*Primary Examiner*—Edward Wojciechowicz
(74) *Attorney, Agent, or Firm*—Posz Law Group, PLC

(57) ABSTRACT

In a vertical type MOSFET device having a super junction structure, in which a N conductive type column region and a P conductive type column region are alternately aligned, regarding to a distance between a terminal end of an active region and a terminal end of a column region, the terminal end of the column region is disposed at a position, which is separated from the active region terminal end by a distance obtained by subtracting a half of a width of the N conductive type column region from a distance corresponding to a depth of the column region. Thus, an electric field concentration at a specific portion in a region facing a narrow side of the column structure is prevented so that a breakdown voltage of the vertical type MOSFET is improved.

6 Claims, 12 Drawing Sheets

$W_N$: N TYPE COLUMN REGION WIDTH
$W_P$: P TYPE COLUMN REGION WIDTH
L : TERMINAL END REGION LENGTH
D : COLUMN DEPTH

W<sub>N</sub>: N TYPE COLUMN REGION WIDTH
W<sub>P</sub>: P TYPE COLUMN REGION WIDTH
D : COLUMN REGION DEPTH $W_N$: N TYPE COLUMN REGION WIDTH
L: TERMINAL END REGION LENGTH
D: COLUMN DEPTH

VERTICAL TYPE SEMICONDUCTOR DEVICE

FIELD OF THE INVENTION

The present invention is related to a vertical type semiconductor device having high breakdown voltage, which is, for example, suitable for MOS.

BACKGROUND ART

A structure of a conventional vertical type MOS field effect transistor (i.e., a vertical type MOSFET) or the like is shown in FIG. 11 (See Japanese Patent Application Publication No. 2002-184985). In the structure, a N conductive type semiconductor region 2 and a P conductive type semiconductor region 3 are disposed in a trench having a predetermined depth in a substrate depth direction. These regions 2, 3 are alternately aligned on a semiconductor substrate 1. This is a columnar structure known as "a super-junction structure." A column region 4 having the columnar structure is formed on the semiconductor substrate 1. An active region 13 is formed on the column region 4 so that a device structure having high breakdown voltage and low on-state resistance is provided. The active region 13 is composed of a source region 7, a gate region 11 and a body region 6.

In an outer periphery 141 of the column region, it is important to increase a breakdown voltage at a connection between a N conductive type semiconductor region (i.e., a N conductive type column region 2) and a P conductive type semiconductor region (i.e., a P conductive type column region 3). Accordingly, the conventional vertical type MOSFET has a cross section, in which the N conductive type column region 2 and the P conductive type column region 3 are aligned on the semiconductor substrate 1 alternately. A distance from an utmost outer periphery of the active region 13 to a terminal end 16 of the column region 4 is equal to or larger than a depth of the column region 4.

FIG. 2A is a layout chart showing the column region 4, which is constructed such that the N conductive type column region 2 and the P conductive type column region 3 are alternately aligned on the semiconductor substrate.

A shown in FIG. 2A, the P conductive type column region 3 is constructed such that multiple regions are aligned as a rectangular striped shape, and each region has a polygonal shape. Here, the polygon having the rectangular striped shape has a pair of wide sides, which face each other. Further, the polygon has another pair of narrow sides, which are disposed on both ends of the wide sides. Accordingly, for example, in case of a quadrangle, the polygon is obtained by spreading one pair of facing sides of the quadrangle having two pair of facing sides. The spread sides provide wide sides, and the other sides provide narrow sides. In a case where the polygon is a hexagon, one pair of facing sides is spread so that the one pair of spread sides provides a pair of wide sides, and the other two pairs of facing sides provide two pairs of narrow sides. Here, in FIG. 2A, the active region 13 is shown as a dashed line so that the positioning relationship of the active region 13 is clearly defined.

Conventionally, a structure having a cross section along with line IA—IA in FIG. 2A is well-known. The IA—IA cross section corresponds to a region facing the wide side of the P conductive type column region in the structure, in which the N conductive type column region 2 and the P conductive type column region 3 are alternately aligned with a rectangular striped shape on the semiconductor substrate.

However, it has not studied substantially about an effective structure of a structure corresponding to the IB—IB cross section shown in FIG. 2B. The IB—IB cross section corresponds to the region facing the narrow side of the P conductive type column region 3. On the substrate surface, it is obvious that the breakdown voltage becomes larger as the distance from the utmost outer periphery of the active region 13 to the terminal end of the column region 4 becomes longer. In general, it is required for the semiconductor device to become minimized. Therefore, it is required to produce a condition for meeting with a small sized device having high breakdown voltage and low on-state resistance.

In view of the above problem, it is an object of the present invention to provide a structure providing a small sized device having sufficient breakdown voltage and sufficient on-state resistance in a high breakdown voltage semiconductor device, in which a N conductive type column region and a P conductive type column region are alternately aligned on a semiconductor substrate.

DISCLOSURE OF THE INVENTION

To obtain the above object, the inventors have studied about the distance between the terminal end 17 of the active region 13 and the terminal end 16 of the narrow side of the P conductive type column region 3 in the column region 4. The terminal end 17 of the active region 13 is determined as a terminal end of a body contact region. The distance is defined as a terminal end region length L. The inventors have obtained knowledge that it is required for the terminal end region length L to be equal to the depth of a depletion layer spreading in a substrate depth direction of the column region when the column region is completely depleted.

The outline of this knowledge is explained with reference to the drawings. FIG. 3 is a partial cross sectional view showing the structure of the column region 4, in which the N conductive type column region 2 and the P conductive type column region 3 are alternately aligned. As shown in this drawing, the region comprising the N conductive type column region 2 and the P conductive type column region 3 is designed to deplete the column region 4 completely. Specifically, the region is designed in such a manner that a half of a width (i.e., $W_N$ or $W_P$) of each column region in a horizontal direction of a substrate surface is depleted, respectively, and full depth (i.e., D) of each column region in a vertical direction of the substrate surface is depleted, respectively. To determine the breakdown voltage of the semiconductor device on the basis of the column structure, it is required for the width of the depletion layer spreading in the horizontal direction of the substrate surface to be equal to the depth of the depletion layer spreading in the vertical direction of the substrate. Thus, the distance from the terminal end 17 of the active region 13 defined as a terminal end of the body contact region 8 to the terminal end 16 of the column region 4 is necessitated to design as follows.

The designing of the distance is explained with reference to FIG. 4, which is a perspective cross sectional view showing the semiconductor device having the column structure. When the device is applied to the breakdown voltage, the terminal end of the depletion layer, i.e., the utmost outer periphery of the depletion layer spreading from the terminal end of the active region 13 in the horizontal direction of the substrate is disposed outside of the terminal end 16 of the column region by a length of a half of the width (i.e., $W_N$) of the N conductive type column region. Accordingly, the terminal end 16 of the column region is disposed at a position, which is separated from the terminal end 17 of the active region by a distance obtained by subtracting the length of a half of the width of the N conductive type column region from the distance corresponding to the depth (i.e., D)

of the column region. In this case, the depletion layer spreading in a region facing the narrow side of the P conductive type column region 3 spreads to be equivalent to the depletion layer spreading in the vertical direction of the substrate surface. Therefore, electric field does not concentrate at a specific part in the depletion layer.

Thus, the distance from the terminal end 17 of the active region facing the narrow side of the active region to a P-N junction disposed at the terminal end 16 of the column region facing the narrow side of the column region is defined as a terminal end region length L. When the length L satisfies the numerical formula No. 1, there is no portion having low breakdown voltage lower than a design value. Thus, it is possible to design and manufacture the vertical type semiconductor device having minimum dimensions, sufficient breakdown voltage and sufficient on-state resistance.

$$L+W_N/2 \geq D \qquad \text{(Numerical formula No. 1)}$$

Here, L represents the terminal end region length, $W_N$ represents the width of the N conductive type column region, and D represents the depth of the column structure.

In the present invention, the terminal end region length L is defined as the distance between the terminal end of the body contact region (8) as the terminal end (17) of the active region to the terminal end (16) of the column region. The width of the first semicodncutor region (2) is defined as $W_1$, and the depth of the column region is defined as D. The present invention is characterized in that the device is designed to satisfy the formula of $L \geq D-W_1/2$.

Thus, it is possible that the width of the depletion layer spreading from the inside of the column region (4) toward the terminal end (16) of the column region spreads to be equivalent to the width of the depletion layer spreading from the inside of the column region in the depth direction of the substrate. Thus, the electric field is prevented from concentrating at a specific part in a region facing the narrow side of the column structure. The breakdown voltage of the vertical type semiconductor device (i.e., the vertical type MOSFET) is improved.

In another embodiment of the present invention, the vertical type semiconductor device is formed on a (110)-Si surface substrate having a first conductive type, and the device includes a semiconductor region (3), which has a second conductive type and has an outline (i.e., outer shape) composed of a surface including at least one pair of a (111)-Si surface of silicon crystal. The distance from the terminal end of the body contact region (8) providing the terminal end (17) of the active region to the terminal end portion (16) disposed on the narrow side of the second semiconductor region (3) in the column region (4) is defined as the terminal end region length L. The first semiconductor region width is defined as $W_1$, and the column structure depth is defined as D. The other embodiment is characterized in that the device is constructed to satisfy the relationship of $L \geq (D-W_1/2)/\sin 35.27$.

Further, in further another embodiment of the present invention, the vertical type semiconductor device is formed on a (110)-Si surface substrate having a first conductive type, and the device includes a semiconductor region (3), which has a second conductive type and has an outline (i.e., outer shape) composed of a surface including at least one pair of a (111)-Si surface of silicon crystal. The distance from the terminal end of the body contact region (8) providing the terminal end (17) of the active region to the terminal end portion (16) disposed on the narrow side of the second semiconductor region (3) in the column region (4) is defined as the terminal end region length L. The first semiconductor region width is defined as $W_1$, the column structure depth is defined as D, and the depth of the body region is defined as $D_B$. The further other embodiment is characterized in that the device is constructed to satisfy the relationship of $L \geq \{(D-W_1/2)/\sin 35.27\}+(D_B/\tan 35.27)$.

The above structures described in the other embodiments of the present invention enables to expand the depletion layer spreading toward the terminal end (16) of the column region to be equivalent to the depletion layer spreading from the inside of the column region (4) in the depth direction of the substrate. Since the electric field is prevented from concentrating at a specific part in a region facing the narrow side of the column structure, the breakdown voltage of the vertical type semiconductor device (i.e., the vertical type MOSFET) is improved.

Here, the reference numeral in a bracket of each means described above corresponds to concrete means described in latter described embodiments.

PREFERRED EMBODIMENTS OF THE INVENTION (First Embodiment)

Figure 1B:
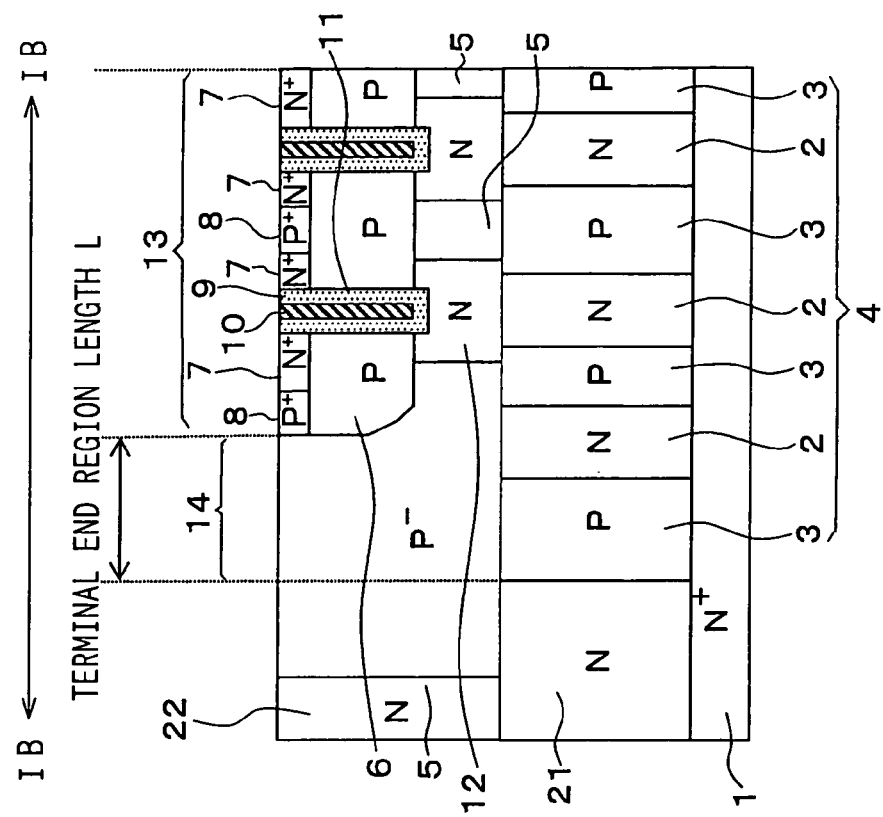
FIGS. 1A and 1B are cross sectional views showing a vertical MOSFET according to a first embodiment of the present invention.
Figure 1A:
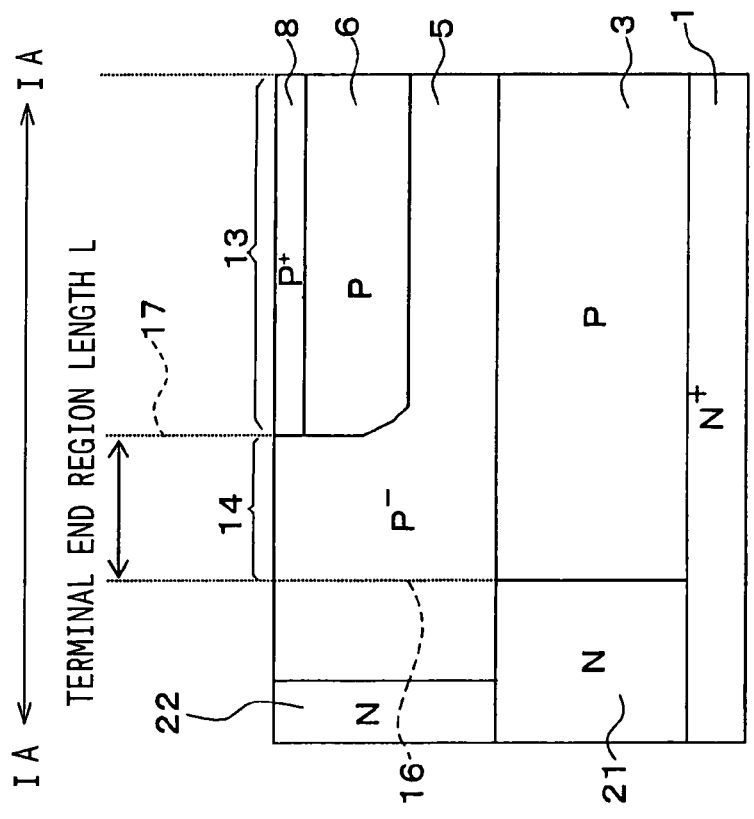

FIGS. 1A and 1B are cross sectional views showing a vertical type MOSFET according to a first embodiment of the present invention. FIG. 1A shows a structure corresponding to a IA—IA cross sectional view facing a narrow side of a P conductive type column region 3 shown in FIG. 2. To understand this embodiment easily, FIG. 1B shows a structure corresponding to a IB—IB cross sectional view facing a wide side of the P conductive type column region 3 shown in FIG. 2. This structure is known conventionally.

The vertical type MOSFET shown in the above drawings is explained. The vertical type MOSFET is formed on a semiconductor substrate having a N+ conductive type. The MOSFET includes a N+ conductive type drain region 1, a column region 4, a N+ conductive type source region 7, a P conductive type body region 6, a P+ conductive type body contact region 8 and a trench gate 11.

The N+ conductive type drain region 1 is formed from the N+ conductive type semiconductor substrate. An electrode made of, for example, aluminum is mounted on a backside of the semiconductor substrate.

The column region 4 is disposed on the N+ conductive type drain region 1. As shown in FIG. 1B, the column structure composing the column region 4 is composed of the P conductive type column region 3 and the N conductive type column region 2, which are alternately aligned. The P conductive type column region 3 is made of P conductive type semiconductor single crystal. The N conductive type column region 2 is made of N conductive type semiconductor single crystal. In FIG. 1A, only a cross section of the P conductive type column region 3 in the column region 4 is shown. However, actually, the N conductive type column region 2 exists in the column region 4. The N conductive type column region 2 is made of N conductive type silicon single crystal, and is disposed adjacent to the column region 3 in the depth direction of the drawing. The N conductive type column region 2 can be assumed as a drift region of the vertical type MOSFET so that drain current flows through the N conductive type column region 2.

A N conductive type semiconductor region 21 is disposed outside of the column region 4. A boundary between the N conductive type semiconductor region 21 and the P conductive type column region 3 in FIG. 1A provides a column region terminal end 16. A P− conductive type semiconductor single crystal region 5 is disposed on the column region 4 or on both of the column region 4 and the N conductive type semiconductor single crystal region 21 disposed outside of the column region 4.

A P conductive type body region 6 is formed on a substrate surface portion of the P− conductive type semiconductor single crystal region 5, as shown in FIG. 1B. A N+ conductive type source region 7, a P+ conductive type body contact region 8 and a trench are formed in the P conductive type body region 6. A gate insulation film 9 is formed on a sidewall and a bottom of the trench. The gate insulation film 9 is made of, for example, silicon oxide film. An electrode made of poly silicon or the like is embedded in the trench so that a trench gate 11 is formed. The N+ conductive type source region 7 is disposed on the surface of the P conductive type body region 6 and around the trench gate 11. In this structure, when a voltage is applied to the trench gate 11, a channel is formed in a region disposed along with the sidewall of the trench gate 11, which is sandwiched between the source region 7 and the buffer region 12.

The P+ conductive type body contact region 8 is disposed on the surface of the P conductive type body region 6. It is enough that the P+ conductive type body contact region 8 is formed at least in the P conductive type body region 6, which is disposed between the trench gates 11. The P+ conductive type body contact region 8 is also formed on the surface of the P conductive type region 6, which is disposed on the utmost outer periphery of the active region 13. Thus, the electric potential of the P conductive type body region 6, which is disposed on the utmost outer periphery of the active region 13, can be fixed so that parasitic operation is not occurred.

The N conductive type buffer region 12 is disposed to contact the N conductive type column region 2 as the drift region, the trench gate 11 and the P conductive type body region 6. The trench gate 11 is formed to reach the N conductive type buffer region 12. This buffer region 12 can be formed not only under the trench gate 11 but also under the whole active region 13. However, it is preferred that the buffer region 12 is formed only under the trench gate 11. This is because the P conductive type body region 6 disposed between the trench gates 11 is separated from the P conductive type column region 3 electrically so that the P conductive type body region 3 becomes a floating state.

In the vertical MOSFET having the above structure, the terminal end region length L is defined as the distance from the active region terminal end 17 to the P/N junction. The active region terminal end 17 is determined by the utmost outer periphery of the P+ conductive type body contact region 8. The P/N junction is disposed on the column region terminal end 16. The active region 13 and the N conductive type silicon single crystal region 21 are formed to separate therebetween by the terminal end region length so that the terminal end region length L satisfies the numerical formula No. 2. Here, the numerical formula No. 2 is obtained in such a manner that $W_N/2$ in the right side member of the numerical formula No. 1 is shifted to the left side member.

$$L \geq D + W_N/2 \qquad \text{(Numerical formula No. 2)}$$

Here, L represents the terminal end region length, $W_N$ represents the N conductive type column region width, and D represents the column structure depth.

Further, the N conductive type single crystal region 22 is formed from the surface to contact the single crystal region 21. Specifically, the N conductive type single crystal region 22 is disposed over the N conductive type silicon single crystal region 21 and disposed outside of the P− conductive type semiconductor single crystal region 5. This single crystal region 22 is disposed from the same position of the terminal end position of the P conductive type column region 3 or from the outside of the terminal end position toward the outer periphery of the active region 13. Thus, the single crystal regions 21, 22 surround the utmost outer periphery of the device.

The above structure provides that the depletion layer spreading from the inside of the column region 4 toward the column region terminal end 16 spreads to be equivalent to the depletion layer spreading from the inside of the column region 4 to the substrate depth direction. Accordingly, the electric field concentration at the region facing the narrow side of the column structure is prevented so that the breakdown voltage of the vertical type MOSFET is improved.

Figure 5:
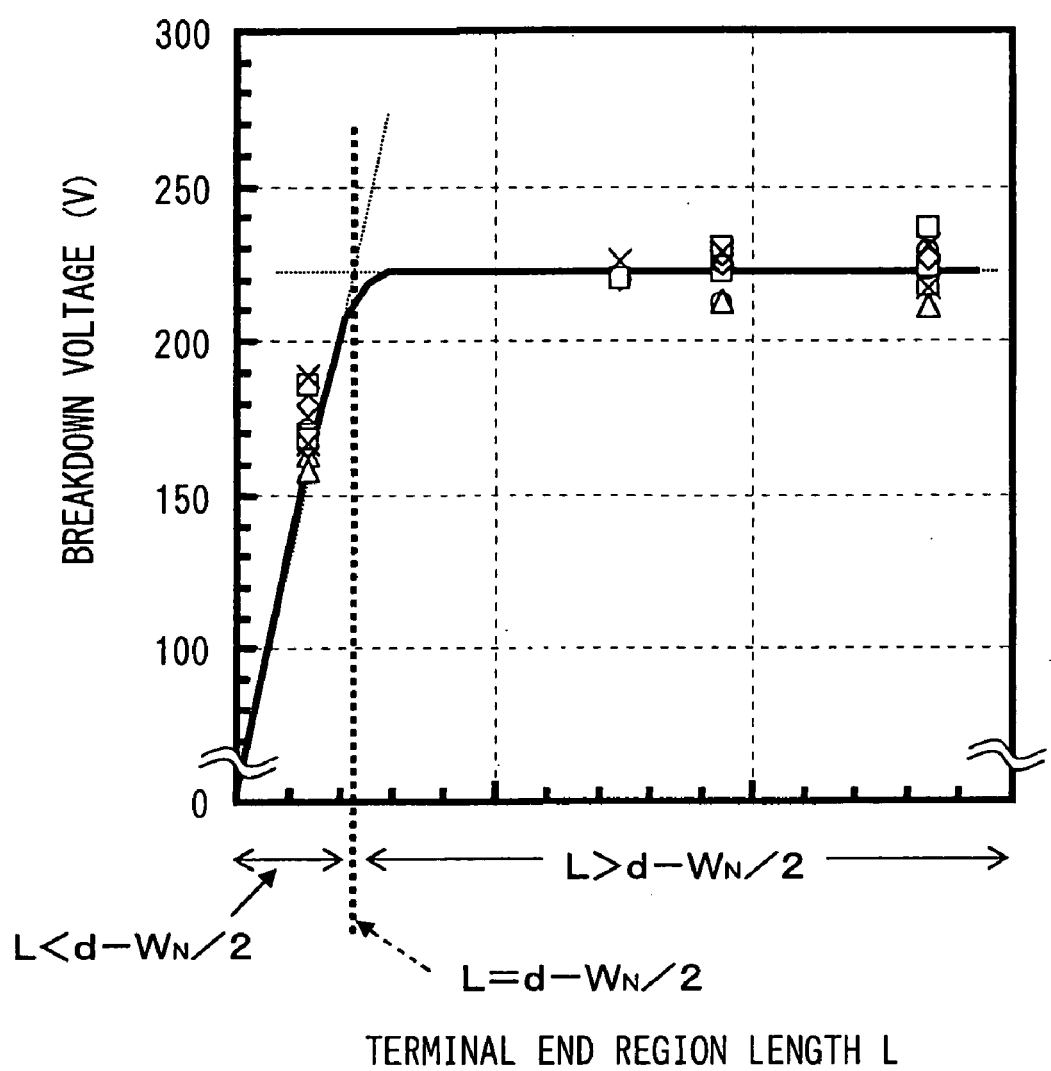
FIG. 5 is a graph showing a terminal end region length L dependency of the breakdown voltage of the vertical type MOSFET according to the first embodiment of the present invention.

FIG. 5 is a graph showing terminal end region length L dependency of the breakdown voltage in the vertical MOSFET having the design breakdown voltage of about 220V, according to this embodiment. The vertical axis of the graph represents the breakdown voltage, the horizontal axis represents the terminal end region length L. When the terminal end region length L is in a range of $L < D - W_N/2$, the breakdown voltage does not satisfy the design value. When the terminal end region length L is in a range of $L \geq D - W_N/2$, the breakdown voltage is saturated near the design value. Thus, $L = D - W_N/2$ becomes the boundary. Accordingly, as shown in this graph, it is confirmed that the minimum dimension of the terminal end region length L can be described as an equation of $L \geq D - W_N/2$.

Here, as described above, the terminal end region length L is determined by focusing only on the repeating structure of the PN junctions in the column region 4. Therefore, the repeating structure of the PN junctions between the buffer layer 12 and the P⁻ conductive type semiconductor single crystal region 5 is not considered. The PN junctions are formed in the depth of the buffer layer 12. This is because the breakdown voltage of the vertical MOSFET according to this embodiment is determined by the depth of the column region 4 so that the breakdown voltage is not determined by the buffer layer 12. Accordingly, as described above, the terminal end region L is determined by only focusing on the repeating structure of the PN junctions in the column region 4.

Figure 2A:
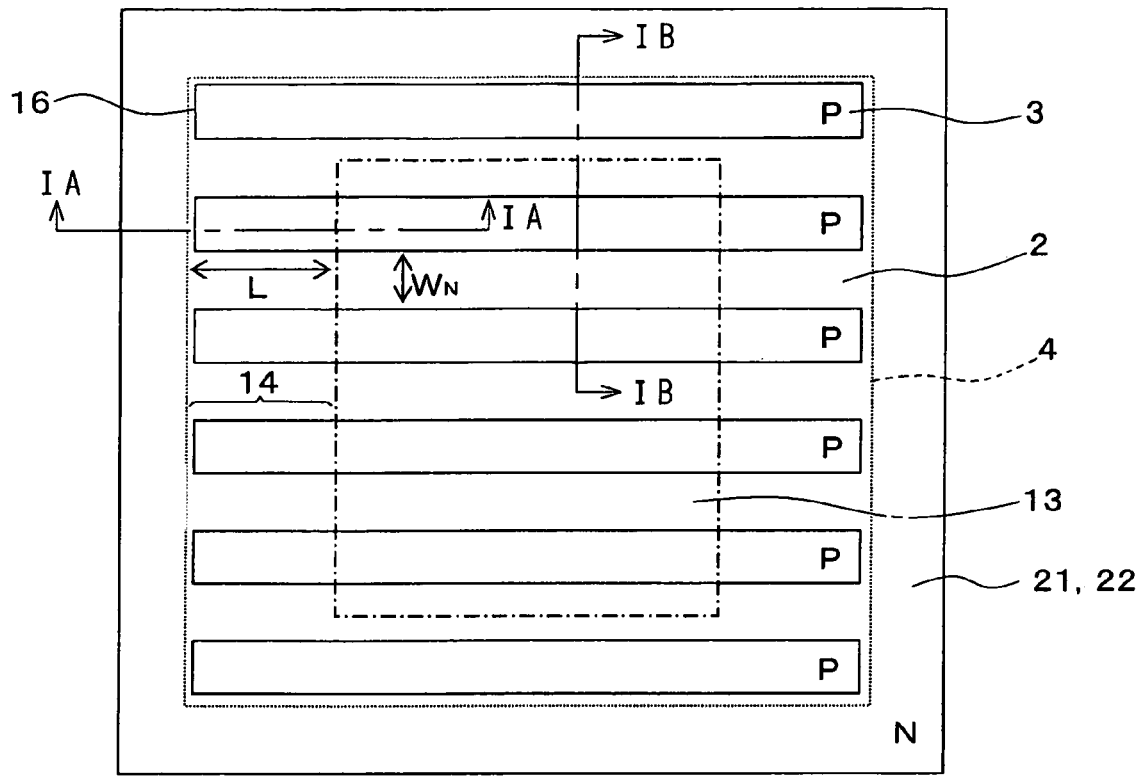
FIG. 2A is a layout chart showing the vertical MOSFET according to the first embodiment of present invention.
Figure 2B:
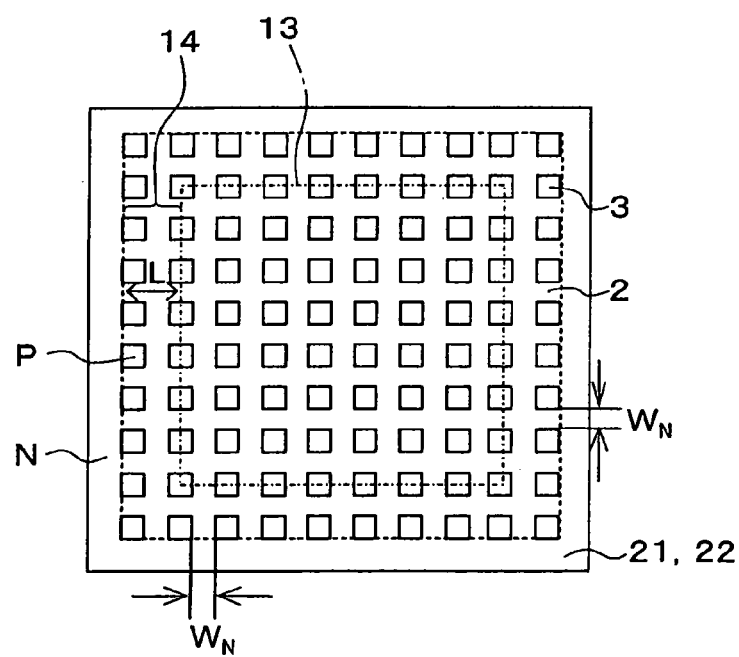
FIG. 2B is a layout chart showing a vertical MOSFET according to another example of the first embodiment.
Figure 2C:
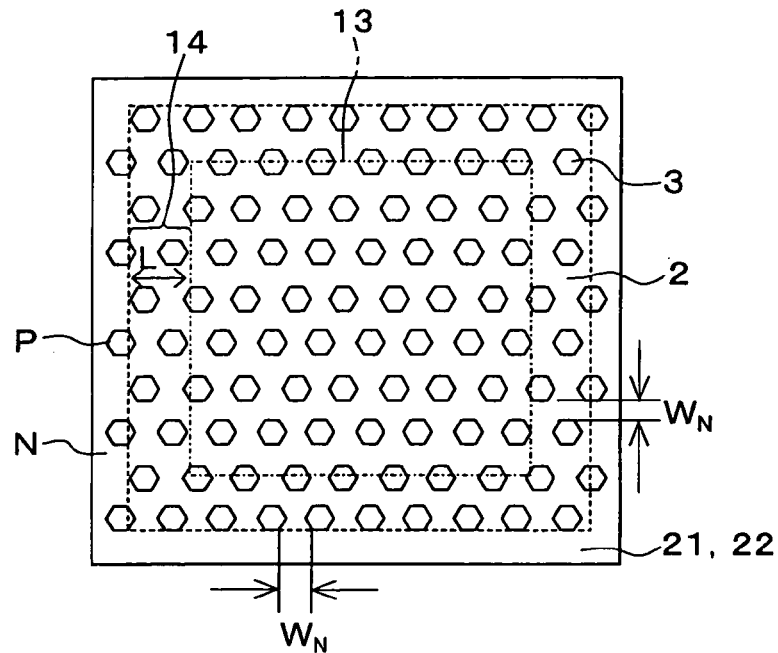
FIG. 2C is a layout chart showing a vertical MOSFET according to further another example of the first embodiment.
Figure 2D:
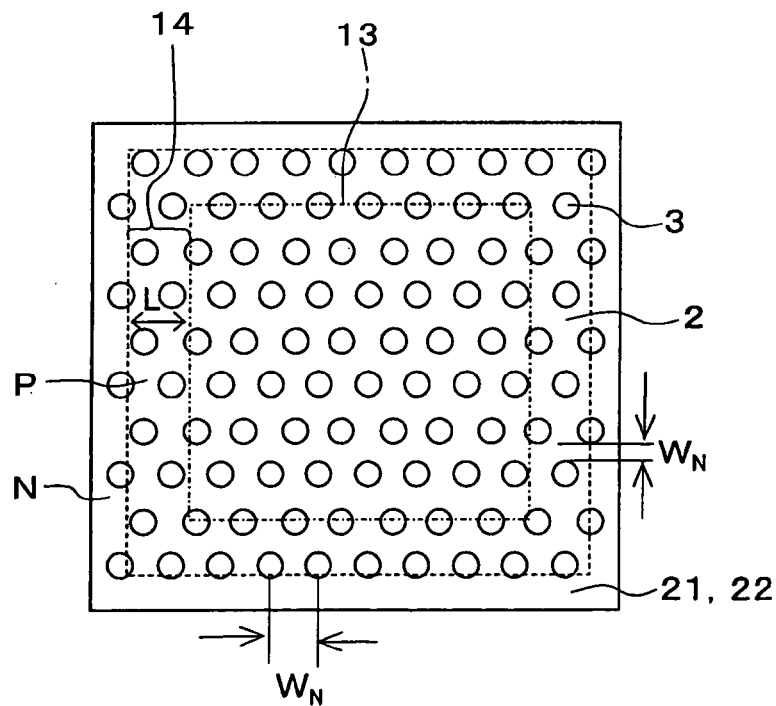
FIG. 2D is a layout chart showing a vertical MOSFET according to furthermore another example of the first embodiment.
Figure 3:
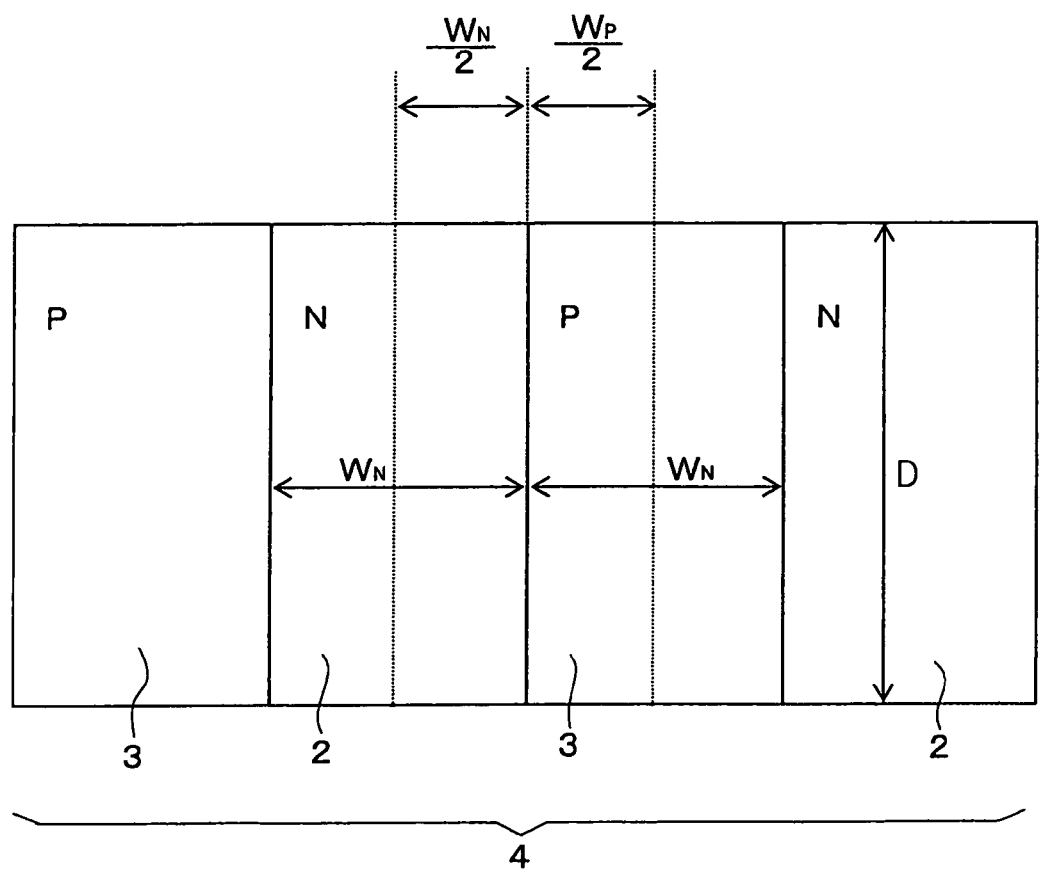
FIG. 3 is a view explaining a spreading state of a depletion layer in a column region according to the present invention.
Figure 4:
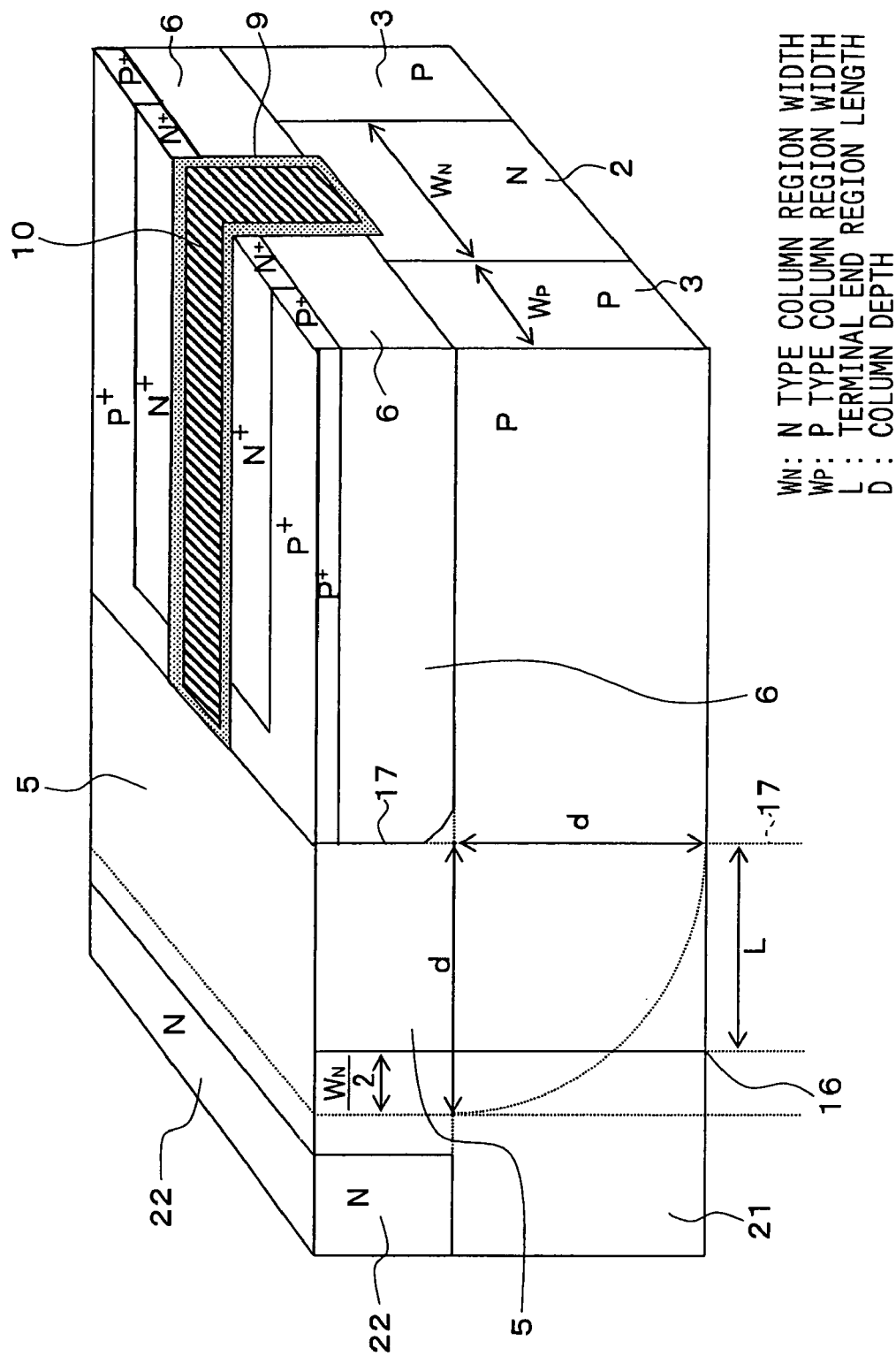
FIG. 4 is a view explaining a position of a terminal end of the column region according to the present invention.

Further, a stripe structure shown in FIG. 2A is shown as an example of the column structure. The column structure can be provided by another structure besides the stripe structure such as a square dot structure shown in FIG. 2B, a hexagonal dot structure shown in FIG. 2C, and a circular dot structure shown in FIG. 2D.

In these cases, the minimum dimension of the terminal end region length L, i.e., the distance between the active region 13 and the terminal end of the column region 4 satisfies the above described relationship. The active region 13 is shown as a dashed line in FIGS. 2B to 2D, and the terminal end of the column region 4 is shown as a dotted line in FIGS. 2B to 2D. Here, the distance between the dots is defined as $W_N$.

Further, the gate structure can be also provided by the stripe structure and a periodic structure having dot structure, similar to the column structure. Even when the gate structure is provided by the stripe structure, the stripe structure can have a positioning relationship not only to be parallel to the column structure but also to be perpendicular to or tilted to the column structure.

(Second Embodiment)

Figure 6A:
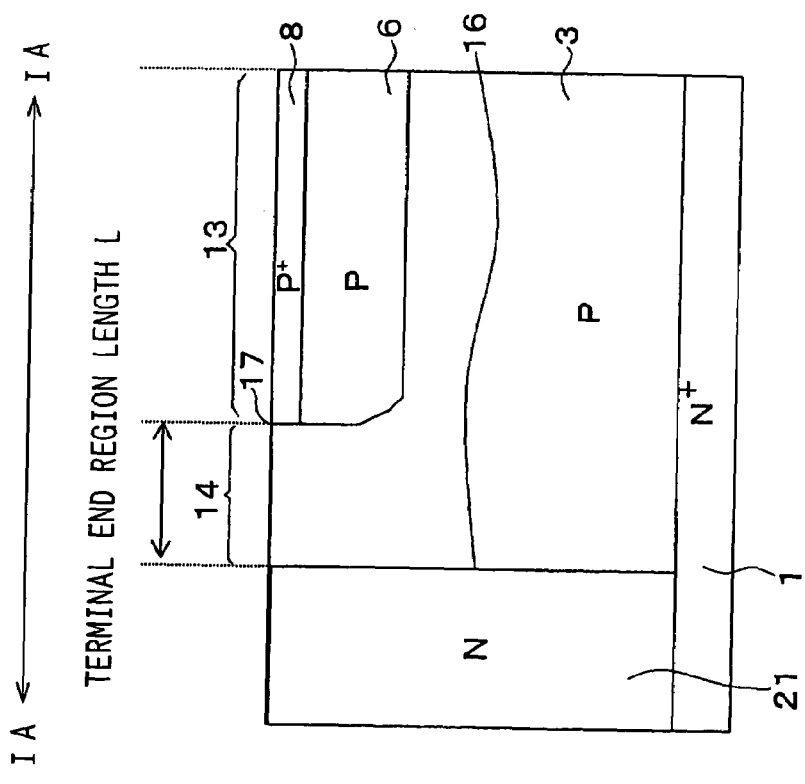
FIGS. 6A and 6B are cross sectional views showing a vertical type MOSFET according to a second embodiment of the present invention.

FIG. 6A is a cross sectional view showing a vertical type MOSFT according to a second embodiment of the present invention. This embodiment is different from the first embodiment, the difference such that no P⁻ conductive type semiconductor single crystal region 5 and no N conductive type buffer region 12 in the cross sectional drawing in FIGS. 1A and 1B is disposed on the substrate surface so that the column structure reaches the substrate surface, which includes no P body region 6.

Figure 6B:
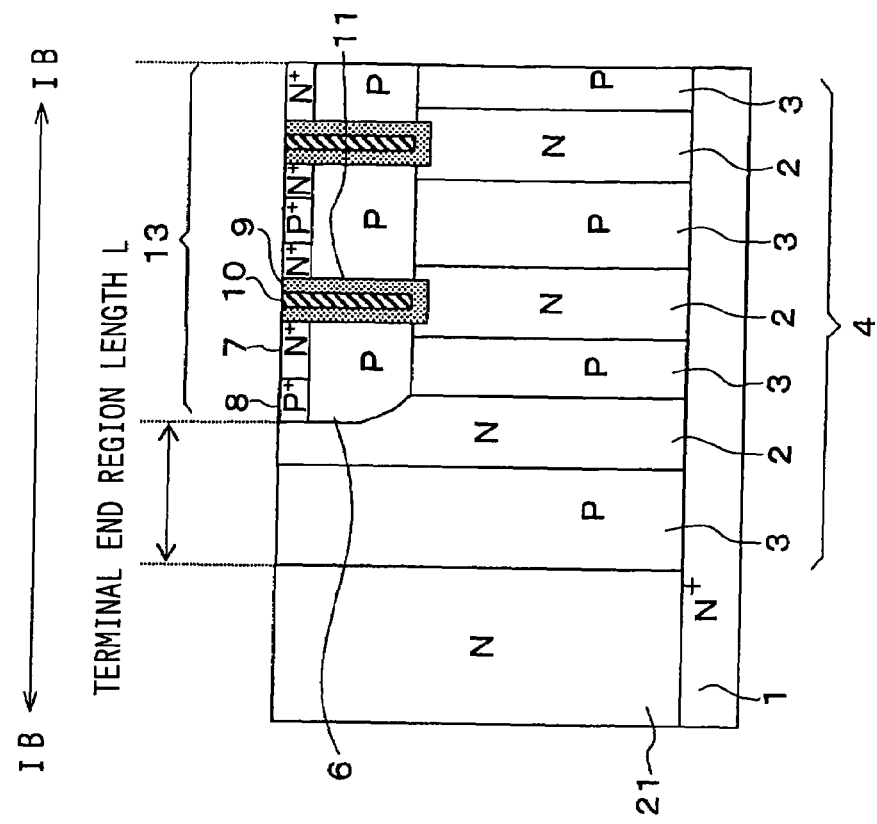

The layout on the substrate surface corresponds to the IA—IA cross sectional structure facing the narrow side of the P conductive type column region 3, that is similar to the first embodiment. Here, FIG. 6B is described to understand this embodiment easily. FIG. 6B shows a structure corresponding to the IB—IB cross sectional structure facing the wide side of the P conductive column region 3 shown in FIG. 2A, the structure which is well-known conventionally.

In the second embodiment, the active region 13 and the N conductive type semiconductor region 21 made of N conductive type silicon single crystal are formed to satisfy the numerical formula No. 2, which is the same equation as the first embodiment.

Thus, in the second embodiment, the depletion layer spreading from the inside of the column region 4 toward the column region terminal end 16 can spread to be equivalent to the depletion layer spreading toward the substrate depth direction of the column region 4. Accordingly, the electric field concentration at the region facing the narrow side of the column structure is prevented so that the breakdown voltage of the vertical type MOSFET is improved.

(Third Embodiment)

Figure 7B:
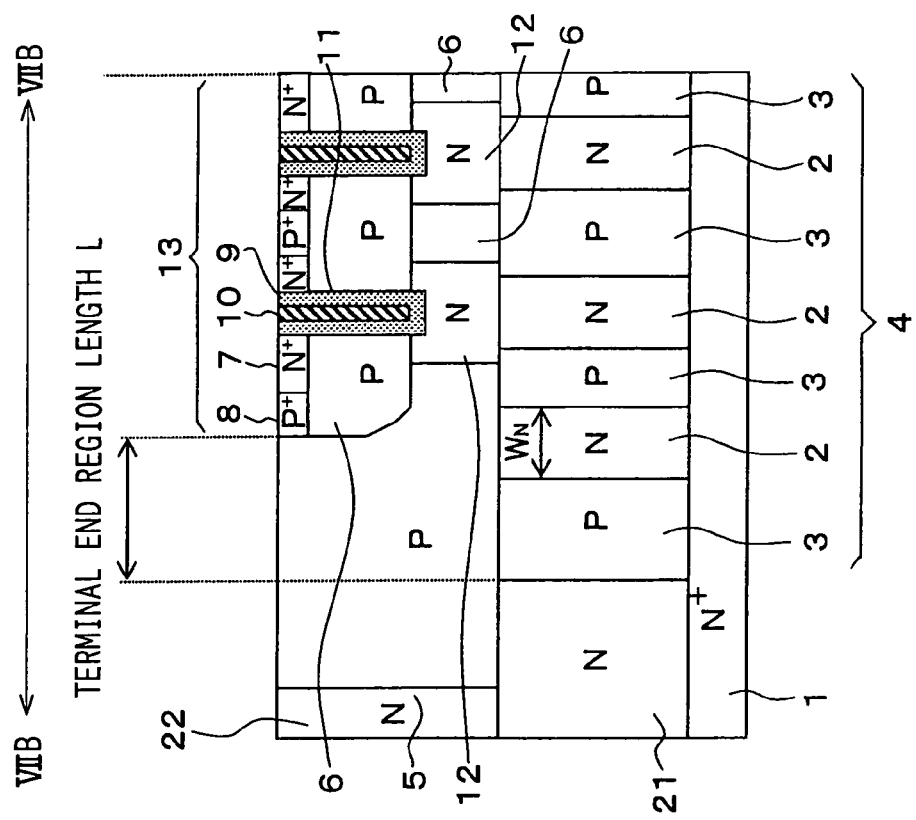
FIGS. 7A and 7B are cross sectional views showing a vertical type MOSFET according to a third embodiment of the present invention.
Figure 7A:
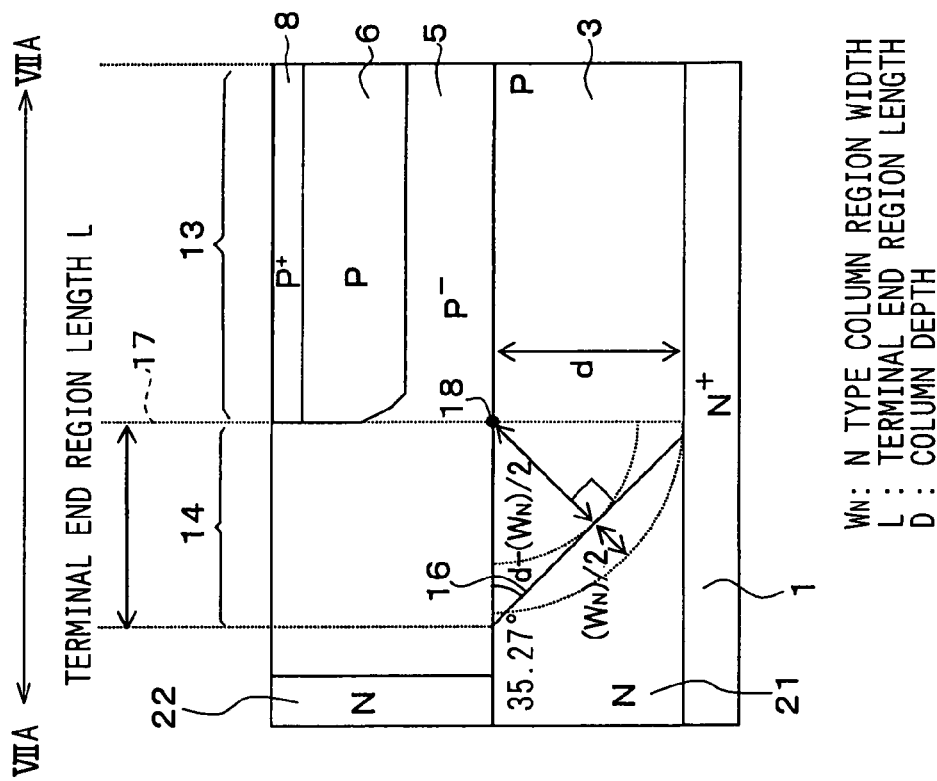

FIG. 7A is a cross sectional view showing a vertical type MOSFET according to a third embodiment of the present invention. FIG. 7A shows a structure corresponding to the VIIA—VIIA cross sectional structure, which faces the narrow side of the P conductive type column region 3 shown in FIG. 8. Here, FIG. 7B is described to understand this embodiment easily. FIG. 7B shows a structure corresponding to the VIIB—VIIB cross sectional structure facing the wide side of the P conductive column region 3 shown in FIG. 8, the structure which is well-known conventionally.

In the third embodiment, similar to the first embodiment, when the column structure is formed, a Si substrate having a (110)-surface is used. The column structure is formed by a wet-etching method utilizing a surface orientation dependency of an etching rate. Therefore, the shape of the column is different from that in the above described embodiments. The other fundamental structures are similar to those of the first embodiment.

In the first and the second embodiment, the PN junction surface at the column region terminal end 16 is disposed perpendicularly to the horizontal direction of the substrate surface. However, in the third embodiment, as shown in FIG. 7A, the PN junction surface at the column region terminal end 16 has an angle of 35.27 degrees from the horizontal direction of the substrate surface. The range of the depletion layer spreading in the substrate is almost the same as the above described embodiment so that the depletion layer spreads in a range having a length obtained by adding the length of a half of the N conductive type column region width $W_N$ to the distance from the terminal end 17 of the active region to the terminal end 16 on the narrow side of the P conductive type column region 3 in the column region 4. The terminal end region length L on the substrate surface can be expressed by a trigonometric function. Specifically, the length L is expressed as follows.

Firstly, a perpendicular line is dropped from the terminal end 17 of the active region in the column region on the substrate surface in the depth direction of the substrate. An intersection between the perpendicular line and the boundary between the P⁻ conductive type semiconductor region 5 and the P conductive type column region 3 is defined as a starting point 18. A circular arc having a radius is drawn, the radius obtained by subtracting the N conductive type column region width WN from the depth of the column. The circular arc contacts the (111)-Si surface, a contact point being between the circular arc and the column region terminal end 16. Then, a normal line is dropped from the contact point to the terminal end of the column region 4. From a relationship among the normal line, the terminal end region length L and a value of sin 35.27, the terminal end region length L can be expressed as a product of the distance and 1/sin 35.27, the distance obtained by subtracting a half of the length of the N conductive type column region width $W_N$ from the column depth D. Accordingly, the terminal end region length L is set to satisfy the numerical formula No. 3.

$$L \geq (D - W_N/2)/\sin 35.27 \qquad \text{(Numerical formula No. 3)}$$

Here, L represents the terminal end region length, $W_N$ represents the N conductive type column region width, and D represents the column structure depth.

Thus, a terminal end region length is defined as the distance from the terminal end 17 of the active region to the PN junction at the column region terminal end 16 on the substrate surface. The terminal end 17 is determined by the utmost outer periphery of the P+ conductive type body contact region 8. The N conductive type semiconductor region 21 composed of the active region 13 and the N conductive type silicon single crystal is formed to separate by the terminal end region length L satisfying the numerical formula No. 3.

In the above structure, the depletion layer spreading from the inside of the column region 4 toward the column region terminal end 16 spreads to be equivalent to the depletion layer spreading from the column region 4 toward the substrate depth direction. Accordingly, the electric field concentration at the region facing the narrow side of the column structure is prevented so that the breakdown voltage of the vertical type MOSFET is improved.

(Fourth Embodiment)

Figure 9B:
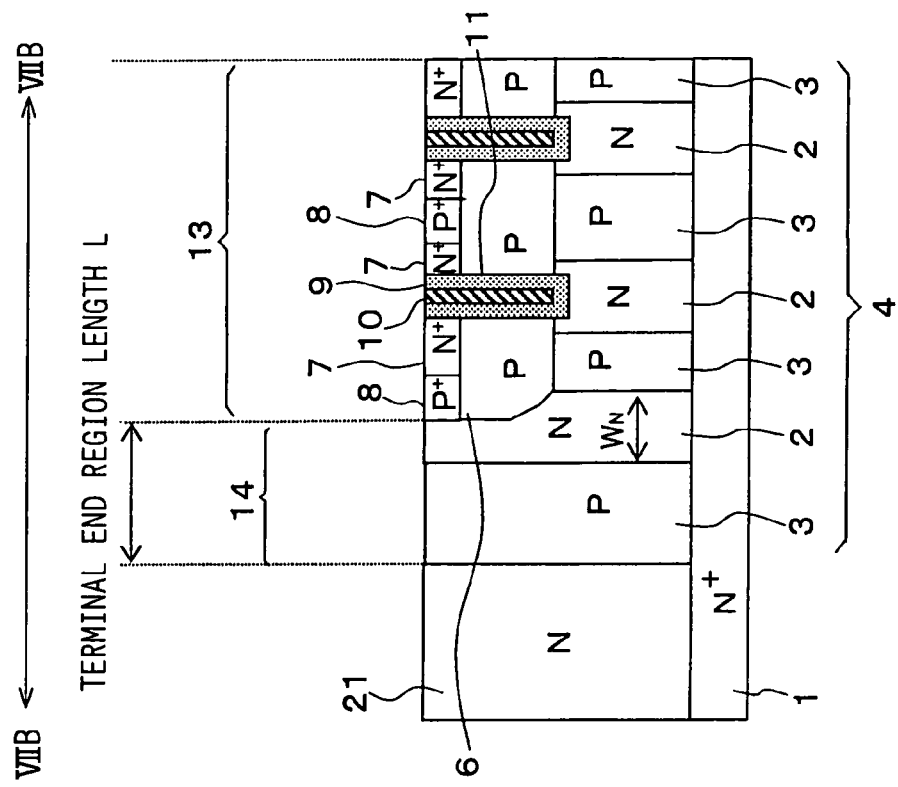
FIGS. 9A and 9B are cross sectional views showing a vertical type MOSFET according to a fourth embodiment of the present invention.
Figure 9A:
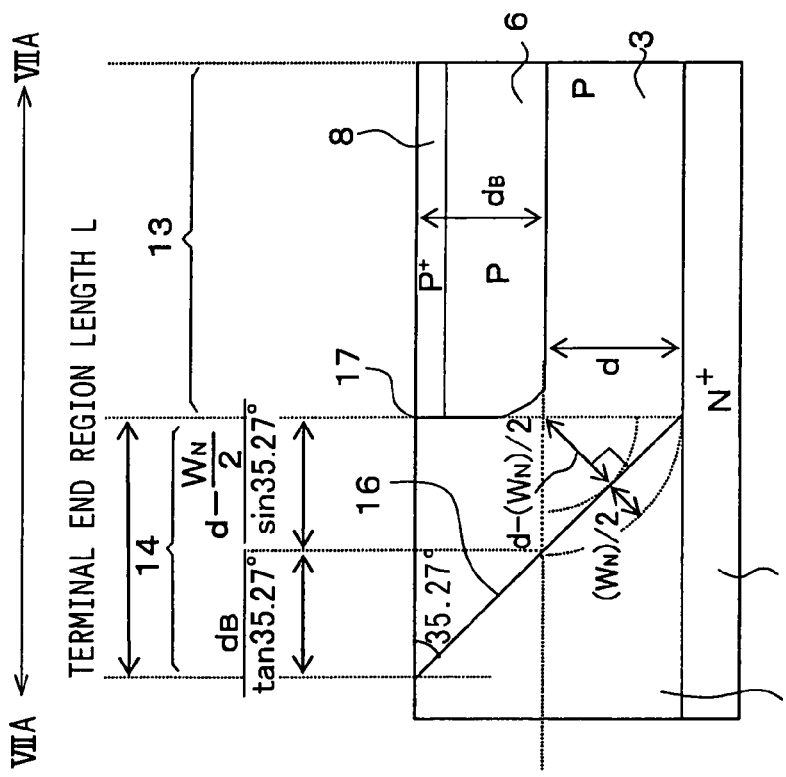

FIG. 9A is a cross sectional view showing a vertical type MOSFET according to a fourth embodiment of the present invention. The difference from the third embodiment is in such a manner that no P− conductive type semiconductor region 5 and no N buffer region 12 on the substrate surface shown in the cross sectional view in FIGS. 7A and 7B in the third embodiment exists; instead, the P conductive type body region 6 is disposed in the column region 4.

Figure 8:
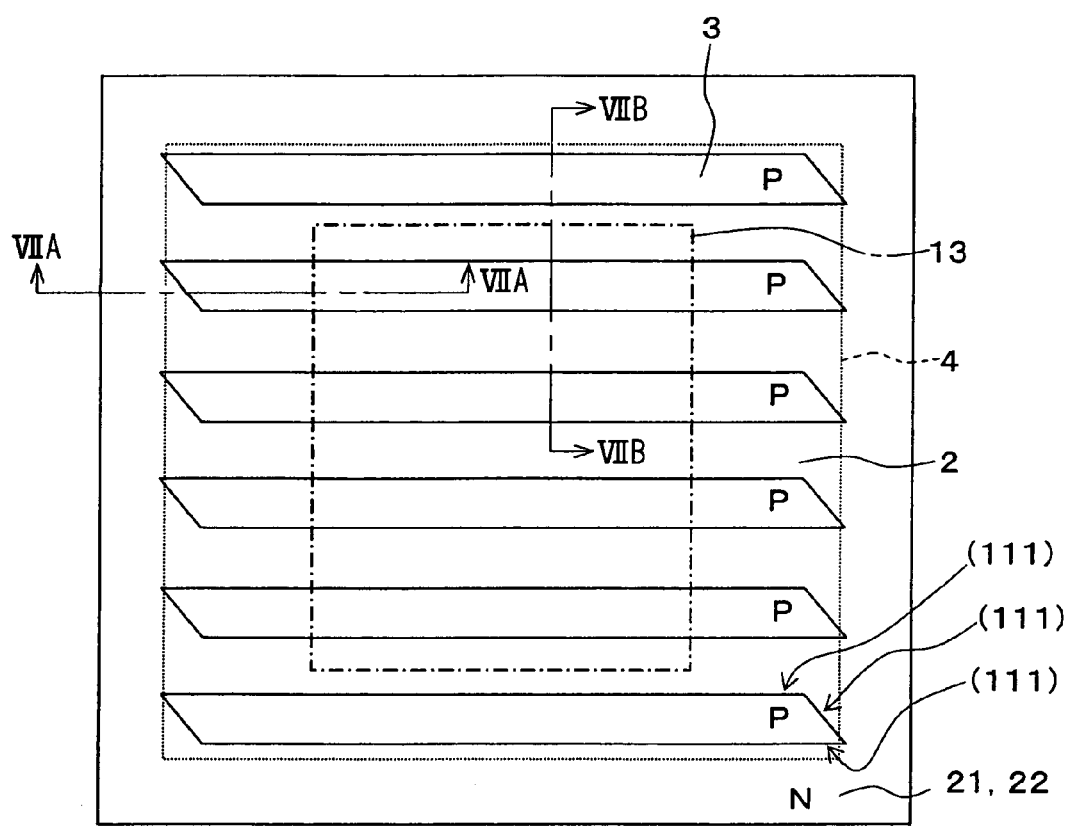
FIG. 8 is a layout chart showing the vertical type MOSFET according to the third embodiment of the present invention.

The layout on the substrate surface, similar to the third embodiment, has a structure corresponding to the VIIA—VIIA cross sectional structure facing the narrow side of the second semiconductor region 3 having the second conductive type shown in FIG. 8. Here, FIG. 9B is described to understand this embodiment easily. FIG. 9B shows a structure corresponding to the VIIB—VIIB cross sectional structure facing the wide side of the second semiconductor region 3 having the second conductive type shown in FIG. 2A, the structure which is well-known conventionally.

In the fourth embodiment, no P− conductive type semiconductor region 5 and no N conductive type buffer region 12 described in the third embodiment exist. Therefore, the PN junction surface at the terminal end 14 existing on the substrate surface is disposed on the outer periphery, compared with the third embodiment. Specifically, the active region 13 and the N conductive type silicon single crystal region 21 are formed to satisfy the numerical formula No. 4. The numerical formula No. 4 is obtained by adding a term (i.e., $D_B/\tan 35.27$) to the numerical formula No. 3. The term has a parameter of the depth (i.e., $D_B$) of the P conductive type body region shown in FIG. 9A.

$L \geq \{(D-W_N/2)/\sin 35.27\}+(D_B/\tan 35.27)$(Numerical formula No. 4)

Here, L represents the terminal end region length, $W_N$ represents the N conductive type column region width, D represents the column structure depth, and $D_B$ represents the P conductive type body region depth.

Thus, in the fourth embodiment, similar to the third embodiment, the depletion layer spreading from the inside of the column region 4 toward the column region terminal end 16 spreads to be equivalent to the depletion layer spreading in the substrate depth direction. Accordingly, the electric field concentration at the region facing the narrow side of the column structure is prevented so that the breakdown voltage of the vertical type MOSFET is improved.

(Fifth Embodiment)

Figure 10:
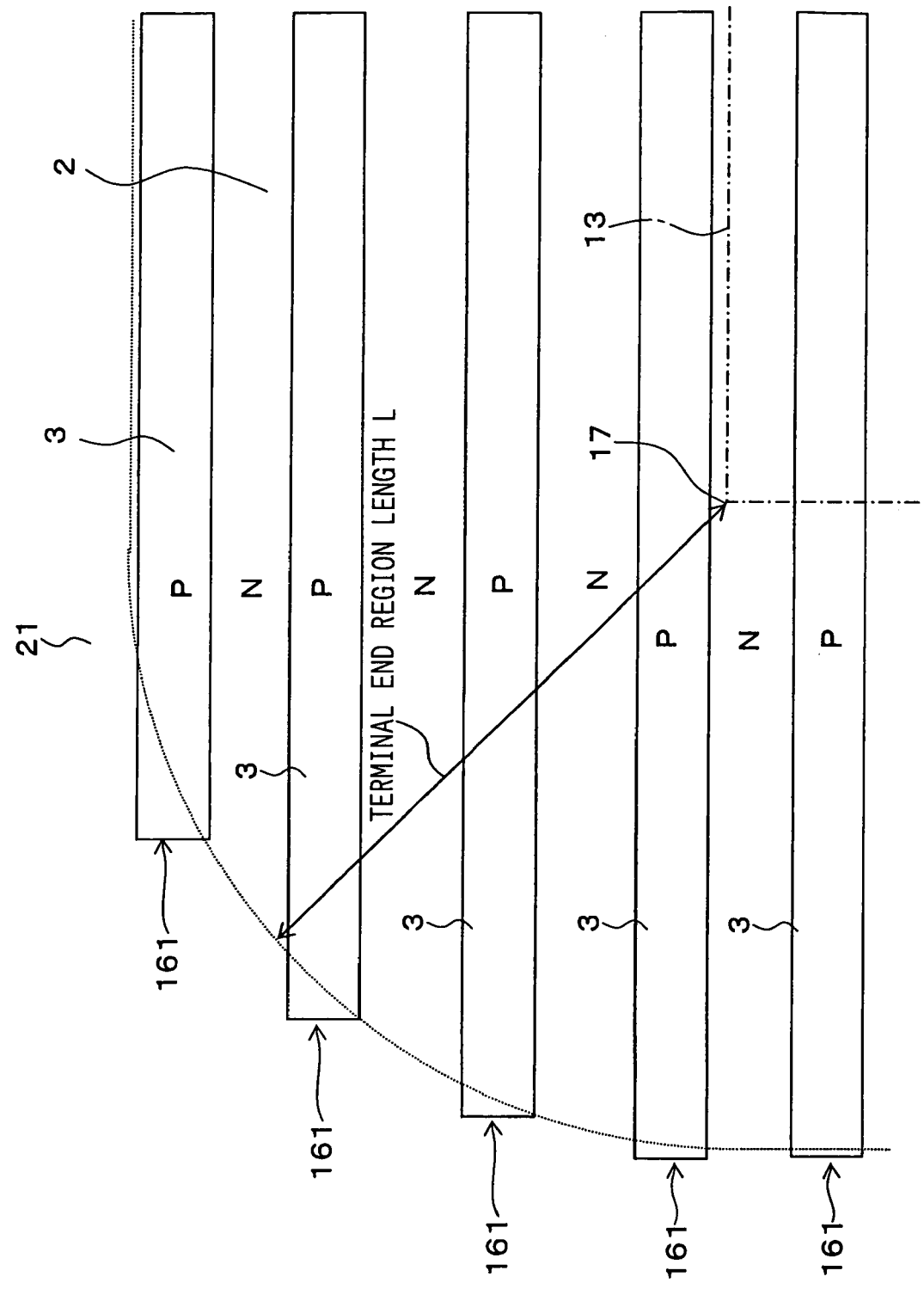
FIG. 10 is a cross sectional view showing a vertical type MOSFET according to a fifth embodiment of the present invention.
Figure 11:
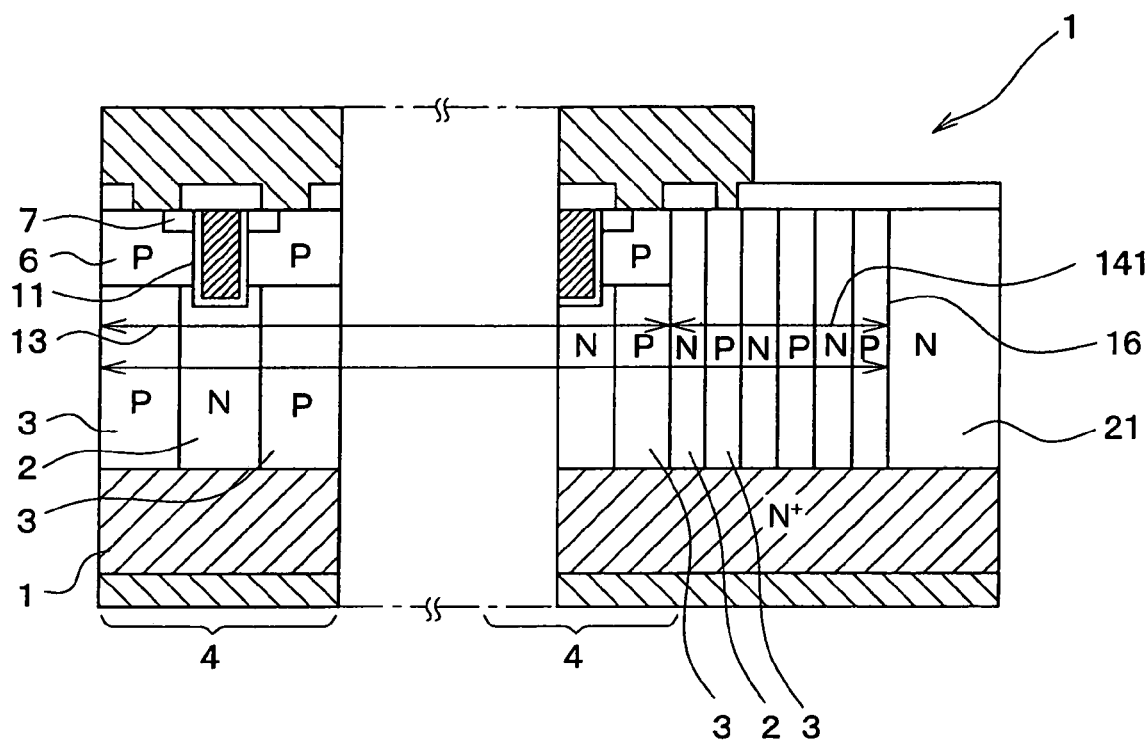
FIG. 11 is a view showing a conventional structure.

In this embodiment, regarding to a corner of the column region described in the fourth embodiment, the electric field concentration at the region facing the narrow side of the column structure is prevented so that the breakdown voltage of the vertical type MOSFET is improved. Specifically, as shown in FIG. 10, the narrow side of the column is disposed outside of a range of the terminal end region length L, the range which is shown as a circular portion separated by the terminal end region length L from the active region terminal end 17 viewing from the upper side of the substrate.

The relationship of the terminal end region length L described in the above embodiments can be similarly applied to the corner of the column region 4. Specifically, in a case where the terminal end region length L satisfies one of the numerical formulas No. 2 to No. 4, the corner of the depletion layer circularly spreads toward the outer periphery from the starting point of the corner of the active region viewing from the upper side of the substrate when the breakdown voltage is applied to the device. At this time, the P conductive type column region terminal end 161 is designed to be outside of a range of the terminal end region length L, so that the terminal end region length L at the corner of the column region 4 in each embodiment satisfies the numerical formula No. 2, No. 3 or No. 4 described in the above embodiments. Accordingly, the structure described in this embodiment provides that a portion having a low breakdown voltage is prevented from being formed locally in the whole semiconductor device.

(Other Embodiments)

Regarding to the column region 4, the width (i.e., $W_N$ or $W_P$) of the P conductive type or the N conductive type column region and the concentration in the P conductive type or the N conductive type column region are not described especially. However, the width (i.e., $W_N$ or $W_P$) of the P conductive type or the N conductive type column region and the concentration in the P conductive type or the N conductive type column region in the whole substrate surface can be constant.

Further, although the present invention is applied to the vertical MOSFET, the present invention can be applied to other vertical semiconductor devices. Furthermore, although the vertical MOSFET has the N conductive type, the vertical MOSFET can have the P conductive type.

The invention claimed is:

1. Semiconductor equipment having a vertical type semiconductor device, the equipment comprising:
   a semiconductor substrate having a first conductive type;
   a column region including a first semiconductor region having the first conductive type and a second semiconductor region having a second conductive type, wherein the first and the second semiconductor regions have predetermined depths in a substrate depth direction of the semiconductor substrate, respectively, wherein the second semiconductor region disposed in the first semiconductor region has a polygonal shape including a stripe shape viewing from a substrate surface side, wherein each of the first and the second semiconductor regions includes a plurality of parts separating each other by a predetermined distance, and wherein the first and the second semiconductor regions are alternately aligned on the semiconductor substrate so that a column structure is provided;
   a third semiconductor region disposed on the semiconductor substrate having the first conductive type and disposed outside of the column region;
   a fourth semiconductor region having the second conductive type, wherein the fourth semiconductor region is disposed on the third semiconductor region, and disposed on the column region or on a range from the column region to the outside of the column region;
   a fifth semiconductor region disposed outside of the fourth semiconductor region, and disposed on the third semiconductor region, wherein the fifth semiconductor region spreads from a surface of the device to the third semiconductor region;
a body region having the second conductive type and disposed on the substrate surface side of the third semiconductor region;
a source region having the first conductive type;
a body contact region having the second conductive type;
a trench, wherein the source region, the body contact region and the trench are disposed in the body region;
a gate insulation layer disposed on a sidewall and a bottom of the trench; and
a trench gate provided in such a manner that an electrode is embedded in the trench through the gate insulation layer, wherein
the source region is disposed around the trench gate and disposed on a surface of the body region,
the body contact region is disposed on a surface of the body region,
the semiconductor substrate and the first semiconductor region are electrically connected,
the column region including the source region, the body region, the body contact region and the trench gate provides an active region,
the body contact region has a terminal end as a terminal end of the active region,
the second semiconductor region has a terminal end on a narrow side of the second semiconductor region in the column region,
a distance from the terminal end of the body contact region to the terminal end of the second semiconductor region is defined as a terminal end region length of L, the first semiconductor region has a width defined as $W_1$, and the column structure has a depth defined as D, and
the terminal end region length of L, the first semiconductor region width of $W_1$ and the column structure depth of D satisfy a relationship of $L \geq D - W_1/2$.

2. Semiconductor equipment having a vertical type semiconductor device, the equipment comprising:
a semiconductor substrate having a first conductive type;
a column region having a first semiconductor region having the first conductive type and a second semiconductor region having a second conductive type, wherein the first and the second semiconductor regions have a predetermined depth in a substrate depth direction of the semiconductor substrate, wherein the second semiconductor region disposed in the first semiconductor region has a polygonal shape including a stripe shape viewing from a substrate surface side, wherein each of the first and the second semiconductor region includes a plurality of parts separating each other by a predetermined distance, respectively, and wherein the first and the second semiconductor regions are alternately aligned on the semiconductor substrate so that a column structure is provided;
a third semiconductor region disposed on the semiconductor substrate having the first conductive type and disposed outside of the column region;
a fourth semiconductor region having the second conductive type, wherein the fourth semiconductor region is disposed on the third semiconductor region, and disposed on the column region or on a range from the column region to the outside of the column region;
a fifth semiconductor region disposed outside of the fourth semiconductor region, and disposed on the third semiconductor region, wherein the fifth semiconductor region spreads from a surface of the device to the third semiconductor region;
a body region having the second conductive type and disposed on the substrate surface side of the third semiconductor region;
a source region having the first conductive type;
a body contact region having the second conductive type;
a trench, wherein the source region, the body contact region and the trench are disposed in the body region;
a gate insulation layer disposed on a sidewall and a bottom of the trench;
a trench gate provided in such a manner that an electrode is embedded in the trench through the gate insulation layer; and
a buffer region having the first conductive type, and disposed to contact the trench gate, the body region and the first semiconductor region, wherein
the source region is disposed around the trench gate and disposed on a surface of the body region,
the body contact region is disposed on a surface of the body region,
the trench gate is disposed to reach the buffer region,
the semiconductor substrate and the first semiconductor region are electrically connected,
the column region including the source region, the body region, the body contact region and the trench gate provides an active region,
the body contact region has a terminal end as a terminal end of the active region,
the second semiconductor region has a terminal end on a narrow side of the second semiconductor region in the column region,
a distance from the terminal end of the body contact region to the terminal end of the second semiconductor region is defined as a terminal end region length of L, the first semiconductor region has a width defined as $W_1$, and the column structure has a depth defined as D, and
the terminal end region length of L, the first semiconductor region width of $W_1$ and the column structure depth of D satisfy a relationship of $L \geq D - W_1/2$.

3. Semiconductor equipment having a vertical type semiconductor device, the equipment comprising:
a semiconductor substrate having a first conductive type;
a column region having a first semiconductor region having the first conductive type and a second semiconductor region having a second conductive type, wherein the first and the second semiconductor regions have a predetermined depth in a substrate depth direction of the semiconductor substrate, wherein the second semiconductor region disposed in the first semiconductor region has a polygonal shape including a stripe shape viewing from a substrate surface side, wherein each of the first and the second semiconductor regions includes a plurality of parts separating each other by a predetermined distance, respectively, and wherein the first and the second semiconductor regions are alternately aligned on the semiconductor substrate so that a column structure is provided;
a body region having the second conductive type and disposed on the substrate surface side of the column region;
a source region having the first conductive type;
a body contact region having the second conductive type;
a trench, wherein the source region, the body contact region and the trench are disposed in the body region;

a gate insulation layer disposed on a sidewall and a bottom of the trench; and a trench gate provided in such a manner that an electrode is embedded in the trench through the gate insulation layer, wherein the source region is disposed around the trench gate and disposed on a surface of the body region, the body contact region is disposed on a surface of the body region, the trench gate is disposed to reach the first semiconductor region, the semiconductor substrate and the first semiconductor region are electrically connected, the column region including the source region, the body region, the body contact region and the trench gate provides an active region, the body contact region has a terminal end as a terminal end of the active region, the second semiconductor region has a terminal end on a narrow side of the second semiconductor region in the column region, a distance from the terminal end of the body contact region to the terminal end of the second semiconductor region is defined as a terminal end region length of L, the first semiconductor region has a width defined as $W_1$, and the column structure has a depth defined as D, and the terminal end region length of L, the first semiconductor region width of $W_1$ and the column structure depth of D satisfy a relationship of $L \geq D - W_1/2$.

4. Semiconductor equipment having a vertical type semiconductor device, the equipment comprising:

a semiconductor substrate having a (110)-Si surface and a first conductive type;

a column region having a first semiconductor region having the first conductive type and a second semiconductor region having a second conductive type, wherein the first and the second semiconductor regions have a predetermined depth in a substrate depth direction of the semiconductor substrate, wherein the second semiconductor region disposed in the first semiconductor region has a polygonal shape including a stripe shape viewing from a substrate surface side, wherein each of the first and the second semiconductor regions includes a plurality of parts separating each other by a predetermined distance, respectively, and wherein the first and the second semiconductor regions are alternately aligned on the semiconductor substrate so that a column structure is provided;

a third semiconductor region disposed on the semiconductor substrate having the first conductive type and disposed outside of the column region;

a fourth semiconductor region having the second conductive type, wherein the fourth semiconductor region is disposed on the third semiconductor region, and disposed on the column region or on a range from the column region to the outside of the column region;

a fifth semiconductor region disposed outside of the fourth semiconductor region, and disposed on the third semiconductor region, wherein the fifth semiconductor region spreads from a surface of the device to the third semiconductor region;

a body region having the second conductive type and disposed on the substrate surface side of the third semiconductor region;

a source region having the first conductive type;

a body contact region having the second conductive type;

a trench, wherein the source region, the body contact region and the trench are disposed in the body region;

a gate insulation layer disposed on a sidewall and a bottom of the trench; and a trench gate provided in such a manner that an electrode is embedded in the trench through the gate insulation layer, wherein the second semiconductor region includes a surface composing an outer shape, the surface including at least one pair of (111)-Si surfaces, the source region is disposed around the trench gate and disposed on a surface of the body region, the body contact region is disposed on a surface of the body region, the semiconductor substrate and the first semiconductor region are electrically connected, the column region including the source region, the body region, the body contact region and the trench gate provides an active region, the body contact region has a terminal end as a terminal end of the active region, the second semiconductor region has a terminal end on a narrow side of the second semiconductor region in the column region, a distance from the terminal end of the body contact region to the terminal end of the second semiconductor region is defined as a terminal end region length of L, the first semiconductor region has a width defined as $W_1$, and the column structure has a depth defined as D, and the terminal end region length of L, the first semiconductor region width of $W_1$ and the column structure depth of D satisfy a relationship of $L \geq (D-W_1/2)/\sin 35.27$.

5. Semiconductor equipment having a vertical type semiconductor device, the equipment comprising:

a semiconductor substrate having a (110)-Si surface and a first conductive type;

a column region having a first semiconductor region having the first conductive type and a second semiconductor region having a second conductive type, wherein the first and the second semiconductor regions have a predetermined depth in a substrate depth direction of the semiconductor substrate, wherein the second semiconductor region disposed in the first semiconductor region has a polygonal shape including a stripe shape viewing from a substrate surface side, wherein each of the first and the second semiconductor regions includes a plurality of parts separating each other by a predetermined distance, respectively, and wherein the first and the second semiconductor regions are alternately aligned on the semiconductor substrate so that a column structure is provided;

a third semiconductor region disposed on the semiconductor substrate having the first conductive type and disposed outside of the column region;

a fourth semiconductor region having the second conductive type, wherein the fourth semiconductor region is disposed on the third semiconductor region, and disposed on the column region or on a range from the column region to the outside of the column region;

a fifth semiconductor region disposed outside of the fourth semiconductor region, and disposed on the third semiconductor region, wherein the fifth semiconductor region spreads from a surface of the device to the third semiconductor region;

a body region having the second conductive type and disposed on the substrate surface side of the third semiconductor region;

a source region having the first conductive type;

a body contact region having the second conductive type;

a trench, wherein the source region, the body contact region and the trench are disposed in the body region;

a gate insulation layer disposed on a sidewall and a bottom of the trench;

a trench gate provided in such a manner that an electrode is embedded in the trench through the gate insulation layer; and a buffer region having the first conductive type, and disposed to contact the trench gate, the body region and the first semiconductor region, wherein the second semiconductor region includes a surface composing an outer shape, the surface including at least one pair of (111)-Si surfaces, the source region is disposed around the trench gate and disposed on a surface of the body region, the body contact region is disposed on a surface of the body region, the trench gate is disposed to reach the buffer region, the semiconductor substrate and the first semiconductor region are electrically connected, the column region including the source region, the body region, the body contact region and the trench gate provides an active region, the body contact region has a terminal end as a terminal end of the active region, the second semiconductor region has a terminal end on a narrow side of the second semiconductor region in the column region, a distance from the terminal end of the body contact region to the terminal end of the second semiconductor region is defined as a terminal end region length of L, the first semiconductor region has a width defined as $W_1$, and the column structure has a depth defined as D, and the terminal end region length of L, the first semiconductor region width of $W_1$ and the column structure depth of D satisfy a relationship of $L \geq (D-W_1/2)/\sin 35.27$.

6. Semiconductor equipment having a vertical type semiconductor device, the equipment comprising:

a semiconductor substrate having a (110)-Si surface and a first conductive type;

a column region having a first semiconductor region having the first conductive type and a second semiconductor region having a second conductive type, wherein the first and the second semiconductor regions have a predetermined depth in a substrate depth direction of the semiconductor substrate, wherein the second semiconductor region disposed in the first semiconductor region has a polygonal shape including a stripe shape viewing from a substrate surface side, wherein each of the first and the second semiconductor regions includes a plurality of parts separating each other by a predetermined distance, respectively, and wherein the first and the second semiconductor regions are alternately aligned on the semiconductor substrate so that a column structure is provided;

a body region having the second conductive type and disposed on the substrate surface side of the column region;

a source region having the first conductive type;

a body contact region having the second conductive type;

a trench, wherein the source region, the body contact region and the trench are disposed in the body region;

a gate insulation layer disposed on a sidewall and a bottom of the trench; and a trench gate provided in such a manner that an electrode is embedded in the trench through the gate insulation layer, wherein the second semiconductor region includes a surface composing an outer shape, the surface including at least one pair of (111)-Si surfaces, the source region is disposed around the trench gate and disposed on a surface of the body region, the body contact region is disposed on a surface of the body region, the trench gate is disposed to reach the buffer region, the semiconductor substrate and the first semiconductor region are electrically connected, the column region including the source region, the body region, the body contact region and the trench gate provides an active region, the body contact region has a terminal end as a terminal end of the active region, the second semiconductor region has a terminal end on a narrow side of the second semiconductor region in the column region, a distance from the terminal end of the body contact region to the terminal end of the second semiconductor region is defined as a terminal end region length of L, the first semiconductor region has a width defined as $W_1$, the column structure has a depth defined as D, and the body region has a depth defined as $D_B$, and the terminal end region length of L, the first semiconductor region width of $W_1$, the column structure depth of D and the body region depth of $D_B$ satisfy a relationship of $L \geq \{(D-W_1/2)/\sin 35.27\} + (D_B/\tan 35.27)$.

* * * * *